United States Patent [19]
Elliott

[11] 3,995,159
[45] Nov. 30, 1976

[54] THERMAL IMAGING SYSTEMS

[75] Inventor: Charles Thomas Elliott, Malvern, England

[73] Assignee: The Secretary of State for Defense in Her Britannic Majesty's Government of the United Kingdom of Great Britain and Northern Ireland, London, England

[22] Filed: Nov. 24, 1975

[21] Appl. No.: 634,556

[30] Foreign Application Priority Data
Nov. 27, 1974 United Kingdom............ 51498/74

[52] U.S. Cl................................. 250/370; 250/334
[51] Int. Cl.².......................................... G01T 1/22
[58] Field of Search ........... 250/330, 334, 370, 371; 357/29, 30

[56] References Cited
UNITED STATES PATENTS 3,488,500  1/1970  Welti ................................. 250/334
3,585,394  6/1971  Higby et al. .................... 250/330 X Primary Examiner—Davis L. Willis
Attorney, Agent, or Firm—Pollock, Vande Sande and Priddy

[57] ABSTRACT

A single three-electrode linear detector replaces the conventional series or parallel linear detector array in a scanned image thermal detection system. The detector comprises an elongated semiconductor/photoconductor strip, typically 0.25 cm long and 50 μm wide, e.g., of cadmium mercury telluride. A bias current in the strip is arranged to give a photocarrier drift velocity in the strip which matches the image scanning velocity thereby giving enhanced image resolution. Modulation in photocarrier current which constitutes the detected image is measured as a bulk resistivity change between two readout electrodes positioned near one end of the strip.

8 Claims, 3 Drawing Figures

THERMAL IMAGING SYSTEMS

The present invention relates generally to thermal radiation imaging devices and systems. Thermal imaging systems are used to convert a focused radiation image, principally in the infra-red spectral region, of the temperature and thermal emissivity differences within a given scene into a visible picture. The invention relates particularly to systems in which the image is scanned region-by-region over one or more detector devices or elements which transform the infra-red radiation into an electrical signal. After suitable amplification and electronic processing this signal can be used to energise an electro-optic transducer or display, such as a cathode ray tube, to provide the visual picture. The detector elements can be made from a semiconductor material, such as cadmium mercury telluride, indium antimonide or lead tin telluride, so that the electrical signal is obtained from a photo-current consisting of free electrons and holes liberated from the bound molecular structure of the material by the infra-red photons.

The simplest form of system described above is one which employs a single detector element over which the whole image is scanned; but improved performance is obtained by using a plurality of detector elements, usually in a line (linear array). The image may be scanned and the elements arranged in such a way that each element samples a separate part of the same image, e.g., a separate line, and therefore operates on a reduced frequency bandwidth, providing an overall improvement in signal-to-noise ratio as compared with a single element detector. This mode of operation is known as the 'parallel scan' mode. Alternatively, the image may be scanned and the elements arranged in such a way that each region or spot of the image is focused onto each element in turn. The signals detected by the individual elements are added together so as to correlate with one another but the noise associated with each is uncorrelated. Thus, this mode of operation, which is known as the 'serial scan' mode, also provides an overall improvement in signal-to-noise ratio.

The parallel and serial scan modes both introduce problems, however. In the parallel scan mode a high degree of uniformity in response is required from all of the elements and this is difficult to achieve. In the serial scan mode the signal produced by each element except the last in the line has to be delayed by a decreasing time interval to compensate for the time required to scan the image along the line. The circuits which are required to provide the appropriate delays are incorporated in the read-out circuitry of the elements, and this read-out circuitry is consequently complex. Furthermore the time required to scan the image along the line needs to be accurately matched to the delays so provided. In both modes the detector elements are normally cooled for operation in the 3 to 5 or 8 to 14 micrometres (μm) infra-red regions of the spectrum whereas the read-out circuitry normally operates at ambient temperatures. Thus it is necessary to provide at least one lead per element plus one common lead out of the cooling vessel; the number of leads involved consequently makes encapsulation of the elements difficult and expensive to provide.

According to the present invention a detector device for use in a thermal radiation imaging system includes an elongated strip of semiconductor material which is photoconductive by the generation of electron and hole photocarriers when a radiation image is scanned along the strip, means for applying lengthwise through the strip a bias electric current producing an ambipolar drift of photocarriers in the strip whose velocity matches the image scanning velocity, first and second readout electrodes connected to the strip near one end of the strip, the positions of the first and second electrodes and the magnitude of the bias current together being such that the transit time required for minority photocarriers in the ambipolar drift to reach to the region between the first and second electrodes is less than the average electron-hole recombination time in the strip, and, connected to the first and second electrodes means for providing an electrical signal representative of the electrical resistivity of the region of the strip between the first and second electrodes. The material of the strip may for example be cadmium mercury telluride, indium antimonide or lead tin telluride.

The first read-out electrode may comprise a region of metal, such as aluminum, deposited across the end of the strip towards which minority carriers are attracted. This electrode may also be one of a pair of electrodes between which the said current is passed, the other being at the other end of the strip. The second read-out electrode, which is preferably deposited across the strip near to the first electrode, may consist of either a region of metal or a semi-conductor region forming a p-n junction with the strip, the junction being reverse-biased by a suitable bias voltage.

The device according to the invention needs only simple read-out circuitry and a small number of leads to the read-out circuitry making encapsulation relatively simple; these features are comparable to the case of a conventional single element detector. The signal to noise ratio obtained however is comparable to that obtained in the parallel and serial scan modes.

When an electric current is applied between two electrodes on a piece of uniformly doped semiconductor material the current consists of two components flowing in opposite directions towards the respective electrodes. Most of the majority carriers, eg electrons if the material is n-type, flow towards one electrode and the minority carriers flow towards the other electrode. The minority carriers travel in packets embedded within a cloud of majority carriers flowing contary to the main majority carrier flow. This is known as the ambipolar drift. The ambipolar drift occurs at a velocity which is slow enough to be matched to an image scan velocity; thus in the present invention the ambipolar drift in the strip, in which most of the minority carriers will be photo-induced, provides a mechanism by which an integrated picture can be built up from all active parts of the strip when the image has been scanned along the strip. Small variations in the image scan velocity can be compensated for by adjusting the bias current. The picture signal is derived by the modulation in electrical resistivity in the region of the strip between the first and second read-out electrodes when the photo-carriers in the ambipolar drift pass through that region. The modulation may simply be detected as the voltage developed between the electrodes. The minority carrier transit time is less than the recombination time so that the minority photo-carriers, from which the picture is built up, are not lost by recombination before they reach the region between the first and second electrodes.

Embodiments of the present invention will now be described by way of example with reference to the accompanying drawings, in which.

Figure 1:
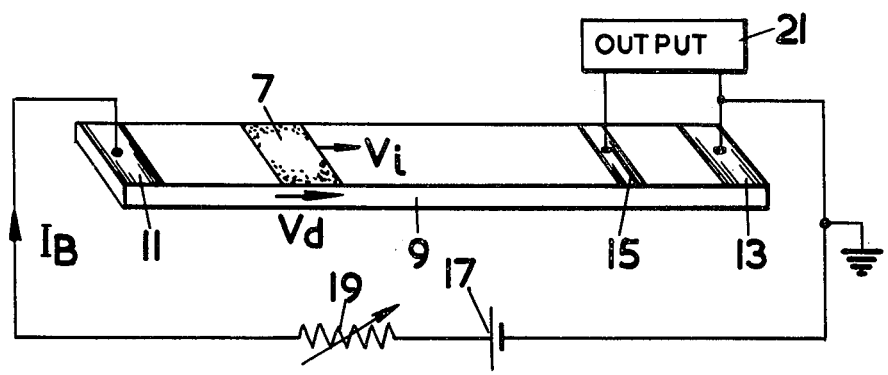
FIG. 1 is a diagram, partly in perspective form and partly in circuit form, of a photoconductive device.

As shown in FIG. 1, a photoconductive device 1 comprises an elongated strip 9 of semiconductor material having a narrow band gap, e.g. cadmium mercury telluride, indium antimonide or lead tin telluride. The device 1 also comprises two metallic electrodes 11 and 13, e.g. of aluminum, deposited at opposite ends of the strip 9 and an electrode 15, e.g. of aluminum, deposited near the electrode 13. A constant bias current $1_B$ is arranged to flow lengthwise through the strip 9 by a battery 17 connected in series with a variable resistor 19 between the electrodes 11 and 13. An output or read-out circuit 21 is connected between the electrodes 13 and 15, which act as read-out electrodes.

Normally, the strip 9 will be cooled to 77°K in a liquid nitrogen cooling vessel (not shown) whereas the battery 17, resistor 19 and the output circuit 21 will be outsie the vessel at room temperature. Hence a conventional encapsulation arrangement (not shown) is required to isolate these two parts of the device 1 thermally whilst providing the appropriate electrical connections between them.

Figure 2:
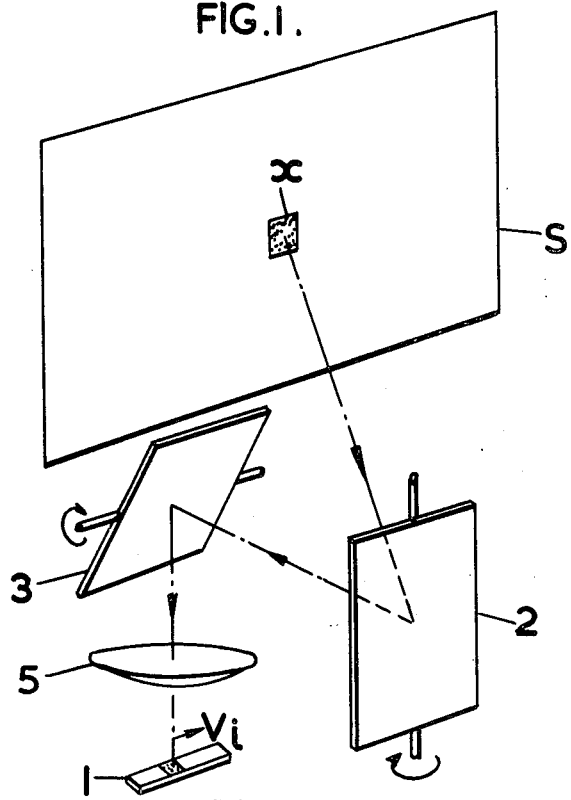
FIG. 2 is a perspective view of an infra-red imaging system, shown in a simplified form, in which the device of FIG. 1 is employed.

An infra-red image is projected onto the strip 9 by a conventional scanning and focussing system shown in FIG. 2, in which the device 1 is also shown with a reduced size and some details missing. The scanning and focussing system is shown in a simplified schematic form as a mirror 2 continuously rotatable about a vertical axis, a mirror 3 rotatable in steps about a horizontal axis and a lens 5. The system scans a scene S in a raster fashion and produces a corresponding infra-red region-by-region on the strip 9 of the device 1.

The image consists of a row of integral elemental image regions corresponding to a row of integral elemental scene regions. The image regions travel along the strip 9 with a velocity $v_i$ by rotation of the mirror 2. One such image region, which corresponds to an elemental region $x$ (FIG. 2) of the scene S is shown as an image region 7 in FIG. 1. Images corresponding to the various rows of elemental regions in the scene S are projected in turn onto the strip 9 by stepwise rotation of the mirror 3. A more practical form for the scanning and focussing system is described U.S. Pat. No. 3,764,192.

The battery 17 is arranged so that minority carriers drift in the strip 9 in the same direction as that in which the image region 7 travels along the strip 9, i.e. towards the electrode 13 as illustrated. The resistor 11 is adjusted so that, as discussed below, the bias current $I_B$ provides a minority carrier drift (more strictly an ambipolar drift) having a velocity $v_d$ which matches the image scan velocity $v_i$.

The infra-red radiation photons forming the image region 7 create electron-hole pairs, i.e. photo-carriers, in the region of the strip 9 on which they are incident, thereby increasing the carrier densities locally above their equilibrium values. Since the excess minority carriers drift towards the electrode 15 with a drift velocity $v_d$ which matches $v_i$, the minority carrier density corresponding to the image region 7 increases continuously during transit towards the electrode 15. The rate of generation of electron-hole pairs along the path of the image region 7 will depend on the photon flux in the image region 7, i.e., the intensity of that region. Thus the excess minority carrier density at any given point along the travel path of the image region 7 increases the local conductivity by an amount which is a measure of the intensity of the image region 7. Since the bias current $I_B$ is constant the conductivity (and hence resistivity) modulation within the strip 9 will give rise to a local electric field variation. The local field variation in the strip 9 corresponding to the image region 7 and each other identical image regions (not shown) is picked up as a voltage change between the electrodes 15 and 13 and is amplified and processed by the output circuit 21 in a conventional way to provide a picture signal.

Assuming that the principal noise source is that due to fluctuation in the background radiation falling on the device 1 it can be shown that the strip 9 gives an improvement F in signal to noise ratio over that of a single conventional background limited photoconductive element by an amount:

$$F = \frac{2L}{l} \qquad \text{equation 1}$$

where $L$ is the distance between the electrodes 11 and 13 and $l$ is the distance between the electrodes 13 and 15. The ratio $2L/l$ indicates the number of conventional photoconductive elements which would be required in a parallel or serial scan system to give a similar performance to the device 1.

The maximum achievable value of the ratio $L/l$ (equation 1) is set by the need to scan an elemental image region along the strip 9 in a time which is less than the minority carrier lifetime. The maximum value is therefore determined by the value of the minority carrier lifetime in the material of the strip 9, and the maximum velocity $v_i$ at which the image can be scanned. If the scene S is made up of 625 lines (rows) each containing 625 picture points (elemental regions) which are scanned along the strip 9 at a frame rate of 25 Hz (i.e., an information bandwidth of $5 \times 10^6$ Hz) the maximum value of $L/l$ can be shown to be about 50 in material with a minority carrier lifetime of 10 $\mu$s and about 5 in material with a minority carrier lifetime of 1 $\mu$s.

It is desirable that the action length of $L$ of the strip 9 be as short as possible in order to minimize (i) the voltage and power supplied by the battery 17 to sweep out the minority carriers and (ii) the scanning velocity $v_1$. Thus in order to minimize L whilst maintaining $L/l$ as large as possible it is necessary to minimize $l$.

The minimum value of $l$ is determined by diffusion effects within the strip 9. If $l$ is made too small information about the scene S is lost because minority carriers representing the same image region 7 reach the region between the electrodes 13 and 15 at different times. It can be shown that in material with a minority carrier mobility of 500 $cm^2v^{-1}s^{-1}$ and a minority carrier lifetime at 10 $\mu$s the minimum acceptable value of $l$ is about 40 $\mu$m.

The width of the strip 9 is approximately equal to $l$ so that the resolution of the displayed picture is approximately the same in the scan direction and orthogonal to it.

In the case where the maximum value of the ratio $L/l$ is about 50 the active length $L$ of the strip will be typically 0.25 cm (for a length $l$ of 50 $\mu$m).

The depth (thickness) of the strip 9 may be about $10^{-3}$ cm.

Preferably the material of the strip 9 is n-type (if cadmium mercury telluride or indium antimonide) and doped lightly to give long minority carrier, i.e., hole, lifetime and low power dissipation. Typical bias conditions (as provided by the battery 17) required to match $v_i$ and $v_d$ and to make the minority carrier recombination time greater than that required for the image 7 to reach the electrode 13 in material with a minority carrier lifetime of 10 $\mu$s and a minority carrier mobility of 500 $cm^2 v^{-1} s^{-1}$ are as follows:

| | | |
|---|---|---|
| bias field across the strip 9 | = 100 | V $cm^{-1}$ |
| bias voltage across the strip 9 | = 25 | V |
| bias current | = 8 | mA |
| bias power | = 200 | mW |

Figure 3:
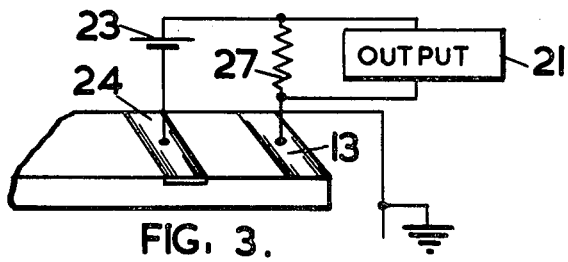
FIG. 3 is a diagram, partly in perspective form and partly in circuit form, of a part of an alternative device which may be employed in the system of FIG. 2.

An alternative form of the device 1 is illustrated in FIG. 3. In this case the electrode 15 is replaced by a non-ohmic electrode 24, e.g., a p-type region forming a p-n junction with the strip 9 (if n-type) the junction being reverse-biased by a bias 23. The output circuit 21 is connected in this case across a resistor 27 connected in series with the bias 23 between the electrodes 24 and 13. The remainder of the device 1 is as described above with reference to FIG. 2.

The minority carriers are extracted from the strip 9 at the reverse-biased electrode 24. Thus a current flows through the resistor 27 which is proportional to the instantaneous density of minority carriers arriving at the electrode 24 and is therefore a measure of the integrated photon flux along the strip 9.

We claim:

1. In a thermal radiation imaging system comprising detector means and scanning means for scanning a thermal radiation image across said detector means, a radiation detector comprising an elongated strip of semiconductor material which is photoconductive by the generation of electron and hole photocarriers when said radiation image is scanned along said strip, means for applying lengthwise through said strip a bias electric current producing an ambipolar drift of photocarriers in said strip whose velocity and direction of drift match respectively the velocity and direction of scanning of said strip, first and second readout electrodes connected to said strip near one end of said strip, said strip having an active length and said readout electrodes having a separation such that minority photocarriers in said drift reach said separation between said readout electrodes in a time less than the average electron-hole recombination time of said semiconductor material.

2. A detector as claimed in claim 1 and wherein said semiconductor material includes cadmium mercury telluride.

3. A detector as claimed in claim 1 and wherein said semiconductor material includes lead tin telluride.

4. A detector as claimed in claim 1 and wherein said semiconductor material is indium antimonide.

5. A detector as claimed in claim 1 and wherein said strip has an active length of approximately 0.25 cm, a width of approximately 50 $\mu$m and an average separation between said readout electrodes of approximately 50 $\mu$m.

6. A detector as claimed in claim 1 and wherein said means for applying the bias current includes at opposite ends of said strip two electrodes one of which is also said first readout electrode.

7. A detector as claimed in claim 6 and wherein each of said electrodes comprises a region of metal.

8. A detector as claimed in claim 6 and wherein said second readout electrode forms a p-n junction with said strip, and said detector includes means for reverse-biasing said p-n junction.

* * * * *